(12) United States Patent
Binns et al.

(10) Patent No.: US 7,675,048 B2
(45) Date of Patent: Mar. 9, 2010

(54) WAFER HOLDING ROBOT END EFFECTER VERTICAL POSITION DETERMINATION IN ION IMPLANTER SYSTEM

(75) Inventors: Brant S. Binns, Beverly, MA (US); Kevin Daniels, Lynnfield, MA (US); Robert A. Poltras, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 354 days.

(21) Appl. No.: 11/682,458

(22) Filed: Mar. 6, 2007

(65) Prior Publication Data

US 2008/0218772 A1 Sep. 11, 2008

(51) Int. Cl.
*H01J 37/20* (2006.01)
*H01J 37/317* (2006.01)

(52) U.S. Cl. .................. 250/492.21; 250/492.2; 250/491.1; 250/442.11; 250/398; 356/622; 438/766; 414/776

(58) Field of Classification Search ............ 250/492.21, 250/492.2, 491.1, 442.11, 398; 438/766; 414/776; 356/622
See application file for complete search history.

(56) References Cited

U.S. PATENT DOCUMENTS

| 5,229,615 | A | * | 7/1993 | Brune et al. ............. 250/492.2 |
| 6,079,927 | A | * | 6/2000 | Muka ........................ 414/217 |
| 2001/0042845 | A1 | * | 11/2001 | van der Muehlen et al. ..................... 250/559.29 |
| 2006/0131514 | A1 | * | 6/2006 | Anc et al. ............... 250/492.21 |

FOREIGN PATENT DOCUMENTS

| EP | 1047114 A | 10/2000 |
| WO | 0060414 A | 10/2000 |

* cited by examiner

*Primary Examiner*—Nikita Wells

(57) ABSTRACT

A wafer handling robot, ion implanter system including a wafer handling robot and a related method are disclosed. An ion implanter system may include an ion implanting station including a load lock coupled thereto; a wafer handling robot located at least partially within the load lock, the wafer handling robot including an end effecter for handling at least one wafer, and a motor for moving the end effecter vertically; and a sensor positioned within the load lock to determine a vertical position of the end effecter.

20 Claims, 1 Drawing Sheet

WAFER HOLDING ROBOT END EFFECTER VERTICAL POSITION DETERMINATION IN ION IMPLANTER SYSTEM

BACKGROUND

1. Technical Field

The disclosure relates generally to integrated circuit (IC) chip fabrication, and more particularly, to a wafer holding robot end effecter vertical position determination in an ion implanter system.

2. Background Art

Ion implantation is a standard IC chip fabrication technique for introducing conductivity altering impurities into, or doping, semiconductor wafers. A typical ion implantation process uses an energetic ion beam to introduce impurities into semiconductor wafers. Introducing the impurities at a uniform depth and dose into the wafers is important to ensure that semiconductor devices being formed operate properly.

As part of IC chip fabrication, and in particular, ion implantation, wafers are moved by multi-axis wafer handling robots from front opening unified pods (FOUPs) that carry the wafers between work locations and the particular work stations. In terms of ion implantation, wafer handling robots typically move wafer(s) from the FOUP, through a load locks (environmental buffer) to an implanting station of an ion implanter system. Each wafer handling robot includes a robotic arm to which an end effecter, which holds one or more wafers, is attached. Each end effecter may include a number of blades, each of which holds a wafer. Each blade may be moved independently of the other blades.

Conventionally, vertical movement of the end effecter is attained by use of a rotary motor coupled to a belt that turns a ball screw (worm gear) that is coupled to the end effecter. Operation of the rotary motor turns the ball screw and moves the end effecter vertically. The location of the end effecter is determined based on an encoder in the rotary motor. That is, the vertical position of the end effecter is determined by data from the rotary motor. One challenge, however, is that, over time, the vertical position of the end effecter relative to the rotary motor can vary. For example, the relative positions can vary due to, among others: slip in relative position of the end effecter, the belt and/or the ball screw; stretching of the belt; gear wear; bending of the end effecter. As a result, the encoder may incorrectly report where the end effecter is vertically positioned. When the vertical position determination is inaccurate, the risk of misalignment of the end effecter with openings through which wafers must pass may occur. In this case, the end effecter or wafer(s) may be damaged.

SUMMARY

A wafer handling robot, ion implanter system including a wafer handling robot and a related method are disclosed. An ion implanter system may include an ion implanting station including a load lock coupled thereto; a wafer handling robot located at least partially within the load lock, the wafer handling robot including an end effecter for handling at least one wafer, and a motor for moving the end effecter vertically; and a sensor positioned within the load lock to determine a vertical position of the end effecter.

A first aspect of the disclosure provides an ion implanter system comprising: an ion implanting station including a load lock coupled thereto; a wafer handling robot located at least partially within the load lock, the wafer handling robot including an end effecter for handling at least one wafer, and a motor for moving the end effecter vertically; and a sensor positioned within the load lock to determine a vertical position of the end effecter.

A second aspect of the disclosure provides a wafer handling robot comprising: an end effecter positioned for movement within a load lock of an ion implanter system, the end effecter handling at least one wafer; a motor for moving the end effecter vertically; and a sensor positioned within the load lock to determine a vertical position of the end effecter.

A third aspect of the disclosure provides a method of determining a vertical position of an end effecter of a wafer handling robot within a load lock of an ion implanter system, the method comprising: positioning a sensor within the load lock; vertically moving the end effecter to trigger the sensor; and determining the vertical position of the end effecter based on triggering of the sensor.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawing that depicts various embodiments of the disclosure, in which.

Figure 1:
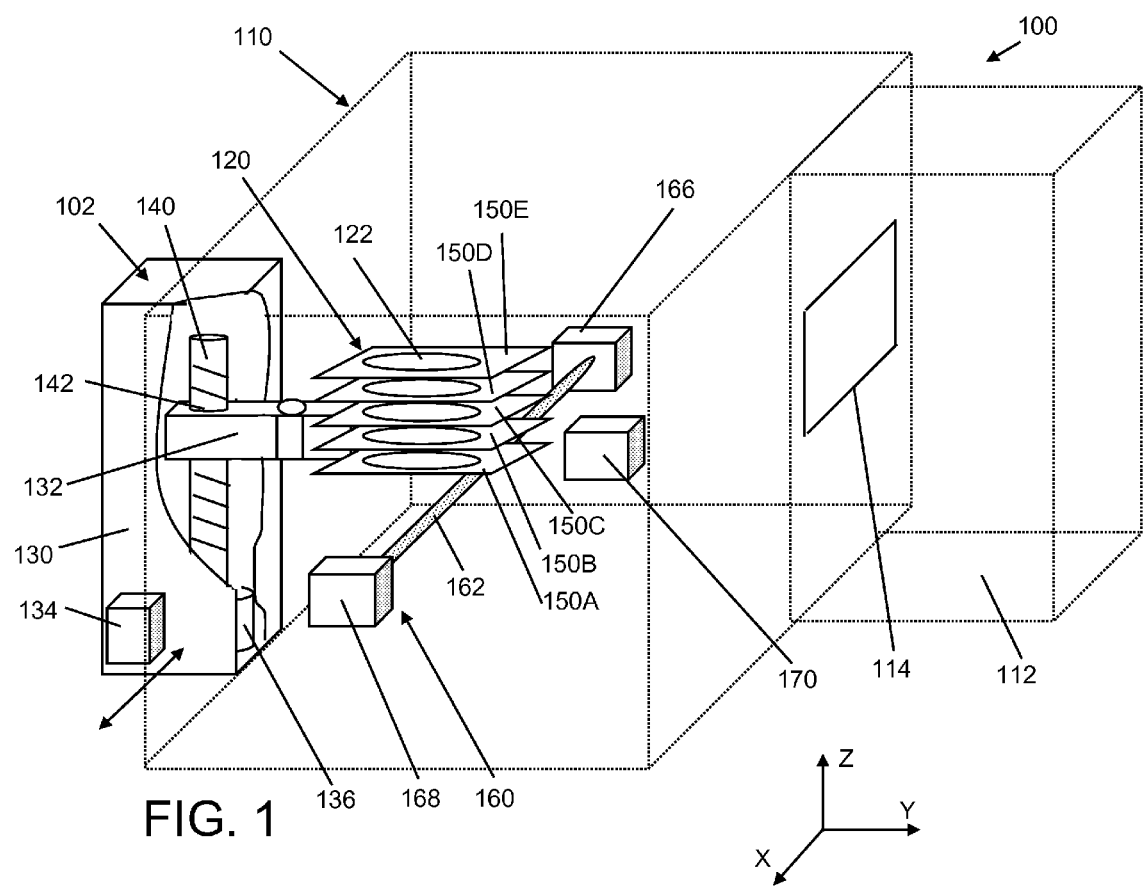
FIG. 1 shows embodiments of a wafer handling robot and ion implanter system according to the disclosure.

It is noted that the drawing of the disclosure is not to scale. The drawing is intended to depict only typical aspects of the disclosure, and therefore should not be considered as limiting the scope of the disclosure.

DETAILED DESCRIPTION

Referring to FIG. 1, embodiments of an ion implanter system 100 including a wafer handling robot 102 are shown. Ion implanter system 100 includes a load lock 110 coupled to an ion implant station 112. Wafers 122 are placed in ion implant station 112 for implanting dopants in a known fashion. As understood, load lock 110 is an environmentally clean and sealed chamber coupled to ion implant station 112. A closable opening 114 in load lock 110 allows ingress and egress of an end effecter 120 of wafer handling robot 102 for inserting and/or removing wafers 122.

Ion implanter system 100 may include any now known or later developed system such as a plasma ion implanter or a beam ion implanter available from, for example, Varian Semiconductor Equipment Associates, Axcelis or Applied Materials. Since the details of the structure of ion implanter system beyond ion implant station 112 is not necessary to the disclosure, no further explanation will be provided.

Wafer handling robot 102 may be located at least partially within load lock 110. As illustrated, a base 130 of wafer handling robot 102 may be located outside of load lock 110; however, wafer handling robot 102 may be positioned entirely within load lock 110. Wafer handling robot 102 includes a robotic arm 132 that provides lateral X and Y direction movement of end effecter 120 under the control of a robot controller 134. A motor 136 under control of robot controller 134 moves end effecter 120 vertically, e.g., by turning a ball screw 140 (worm gear) to which a traveling gear 142 is attached to robotic arm 132. Other mechanisms (e.g., belts, chains, gearing, etc.) for moving robotic arm 132 may also be used and are considered within the scope of this invention. Other structure not essential to this disclosure also may be provided to allow lateral X and Y movement of base 130. Wafer handling robot 102 may include any now known or later developed robotic system for wafer handling such as those available from, for example, Brooks Automation.

End effecter 120 is capable of handling at least one wafer 122. In one embodiment, end effecter 120 includes a plurality of blades 150A-E, each blade handling one wafer 122. As illustrated, five blades 150A-E are used. However, any number of blades 150A-E may be used, including one.

A sensor 160 is positioned within load lock 110 to determine a vertical position of end effecter 120 and/or blades 150A-E. In one embodiment, sensor 160 includes a beam 162 that end effecter 120 traverses. In this case, beam 162 extends substantially horizontally within load lock 110. Sensor 160 may include a transmitter 166 and a receiver 168 and may include any commercially available fiber optic sensor, laser sensor or infra-red sensor. In any case, sensor 160 is capable of determining a vertical position when (one or more than one) blade(s) 150 trigger the sensor, e.g., by breaking the beam with a leading or trailing edge. When a particular blade 150A-E triggers sensor 160 as the plurality of blades move vertically, the vertical position of the blade is that of sensor 160. Knowing the spacing between blades 150A-E, the vertical position of each blade can be determined by triggering of sensor 160 by one blade. Alternatively, the vertical position of each blade 150A-E can be determined based on the particular blade triggering sensor 160. Although sensor 160 has been illustrated as a beam type sensor, other sensor types may be employed. For example, sensor 160 may include a Hall effect sensor 170, i.e., a transducer having varying output voltage based changes in magnetic field density.

Embodiments of a method of determining a vertical position of end effecter 120 of wafer handling robot 102 within load lock 110 of ion implanter system 100 are also included. A first process may include positioning sensor 160, 170 within load lock 110, e.g., at a known vertical position. Using end effecter 120, vertically moving end effecter 120 to trigger sensor 160, 170 is next. The vertical position of end effecter 120 can be determined based on triggering of sensor 160, 170. As noted above, sensor 160 positioning may include emitting a substantially horizontal beam 162 from the sensor through which end effecter 120 traverses.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. An ion implanter system comprising:
an ion implanting station including a load lock coupled thereto;
a wafer handling robot located at least partially within the load lock, the wafer handling robot comprising a robotic arm coupled to an end effecter for handling at least one wafer, and a motor for moving the end effecter vertically; and
a sensor positioned within the load lock to determine a vertical position of the end effecter in the load lock.

2. The ion implanter system of claim 1, wherein the end effecter includes a plurality of blades, each blade handling one wafer.

3. The ion implanter system of claim 2, wherein the sensor senses a vertical position of more than one blade as the plurality of blades move vertically.

4. The ion implanter system of claim 1, wherein the sensor includes a beam that the end effecter traverses.

5. The ion implanter system of claim 4, wherein the sensor includes one of: a fiber-optic sensor, a laser sensor or an infra-red sensor.

6. The ion implanter system of claim 4, wherein the sensor includes a transmitter and receiver.

7. The ion implanter system of claim 4, wherein the beam extends substantially horizontally within the load lock.

8. The ion implanter system of claim 1, wherein the sensor includes a Hall effect sensor.

9. A wafer handling robot comprising:
a robotic arm coupled to an end effecter positioned for movement within a load lock of an ion implanter system, the end effecter handling at least one wafer;
a motor for moving the end effecter vertically; and
a sensor positioned within the load lock to determine a vertical position of the end effecter in the load lock.

10. The wafer handling robot of claim 9, wherein the end effecter includes a plurality of blades, each blade handling one wafer.

11. The wafer handling robot of claim 10, wherein the sensor senses a vertical position of more than one blade as the plurality of blades move vertically.

12. The wafer handling robot of claim 9, wherein the sensor includes a beam that the end effecter traverses.

13. The wafer handling robot of claim 12, wherein the sensor includes one of: a fiber-optic sensor, a laser sensor or an infra-red sensor.

14. The wafer handling robot of claim 12, wherein the sensor includes a transmitter and receiver.

15. The wafer handling robot of claim 12, wherein the beam extends substantially horizontally within the load lock.

16. The wafer handling robot of claim 9, wherein the sensor includes a Hall effect sensor.

17. A method of determining a vertical position of an end effecter of a wafer handling robot within a load lock of an ion implanter system, the method comprising:
positioning a sensor within the load lock;
vertically moving the end effecter coupled to a robotic arm of the wafer handling robot to trigger the sensor; and
determining the vertical position of the end effecter in the load lock based on triggering of the sensor.

18. The method of claim 17, wherein the sensor positioning includes emitting a substantially horizontal beam from the sensor through which the end effecter traverses.

19. The method of claim 17, wherein the end effecter includes a plurality of blades, each blade handling one wafer; and the determining includes determining a vertical position of more than one blade as the plurality of blades move vertically.

20. The method of claim 17, wherein the sensor includes one of: a fiber-optic sensor, a laser sensor or an infra-red sensor.

* * * * *